United States Patent [19]

Talambiras

[11] 4,414,639
[45] Nov. 8, 1983

[54] SAMPLING NETWORK ANALYZER WITH SAMPLING SYNCHRONIZATION BY MEANS OF PHASE-LOCKED LOOP

[75] Inventor: Robert P. Talambiras, Springfield, N.J.

[73] Assignee: Dranetz Engineering Laboratories, Inc., Edison, N.J.

[21] Appl. No.: 259,013

[22] Filed: Apr. 30, 1981

[51] Int. Cl.³ ............................................... G06J 1/00
[52] U.S. Cl. ................................. 364/602; 307/269; 307/498; 307/353; 328/133; 329/122; 364/481; 364/608
[58] Field of Search ............... 364/602, 605, 607, 608, 364/481, 487, 829, 851; 328/14, 63, 72, 127, 133, 134, 137, 142, 143, 150, 151, 155, 156, 181, 185, 186; 307/269, 271, 227, 490, 498, 231, 352, 353, 260, 261; 329/50, 122; 375/120; 455/265

[56] References Cited

U.S. PATENT DOCUMENTS

| | | | |
|---|---|---|---|
| 3,344,350 | 9/1967 | Stoft | 324/77 |
| 3,713,029 | 1/1973 | Uchida | 328/63 |
| 3,769,602 | 10/1973 | Griswold | 329/122 |
| 3,789,199 | 1/1974 | Kotwicki | 364/602 |
| 3,944,940 | 3/1976 | Desai | 329/122 |
| 3,982,193 | 9/1976 | Maringer | 328/151 |
| 4,149,256 | 4/1979 | Sumi et al. | 364/602 |
| 4,318,183 | 3/1982 | Byington et al. | 364/602 X |

*Primary Examiner*—Joseph F. Ruggiero
*Attorney, Agent, or Firm*—Richard C. Woodbridge

[57] ABSTRACT

An improved Sampling Network Analyzer is disclosed, in which synchronization of the sampling of one or more input signals, either voltages or currents, is effected by means of a phase-locked loop (PLL). A reference signal serves to synchronize a phase-locked loop, which in turn synchronizes sample-and-hold circuits utilized for measurement. A C preset counter permits the operator to set a desired number of samples per measurement. A Y preset counter maintains the voltage-controlled oscillator within a predetermined (relatively narrow) range of frequencies. Operation of the sample-and-hold circuits is at a frequency that is related to the reference frequency by the ratio of two integers. A D preset counter is provided in the reference signal path to allow the Sampling Network Analyzer to be synchronized to a subharmonic of the reference frequency where the reference frequency is too high to permit the desired number of samples per measurement within a single period.

9 Claims, 5 Drawing Figures

SAMPLING NETWORK ANALYZER WITH SAMPLING SYNCHRONIZATION BY MEANS OF PHASE-LOCKED LOOP

CROSS-REFERENCES TO RELATED APPLICATIONS

Applicant's related application, Ser. No. 258,953, filed simultaneously with the present application, is entitled "Sampling Network Analyzer with Stored Correction of Gain Errors."

BACKGROUND OF THE INVENTION

1. Field of the Invention

This invention relates to sampling network analyzers generally, and more particularly to sampling network analyzers for measuring complex voltage, current, voltage and current ratio, phase angle, and power, including measurements of harmonics as well as fundamental Fourier components. Specifically, the present invention is directed to a sampling network analyzer which incorporates a phase-locked loop to permit the operator to establish a prescribed number of samples per measurement, and to effect such measurement so that the sampling of the input signals occurs coherently with one of the input signals (or with an externally-supplied reference signal). In general, synchronization occurs at a frequency that is related to the frequency of the reference signal by a factor that is the ratio of two integers.

2. Description of the Prior Art

U.S. Pat. No. 3,944,940 discloses a clock pulse generating system in which a sequence of reference pulses is phase-locked to a train of read pulses. In this reference, the PLL employs simple digital logic gates for phase error detection.

U.S. Pat. No. 3,982,193 describes a phase-locked loop arrangement for generating a sampling pulse raster.

U.S. Pat. No. 3,344,350 discloses an improved modulation meter incorporating a phase-locked loop for synchronizing a sampler to a frequency offset from a reference oscillator.

U.S. Pat. No. 3,769,602 describes the use of a phase-locked loop for tracking the phase of a periodic input signal having a repetition rate that may assume one of a number of predetermined values, which may differ by orders of magnitude.

SUMMARY OF THE INVENTION

The present invention is directed to an improved network analyzer of the type having a first sample-and-hold means for receiving a first analog signal and for producing a first sample-and-hold output signal that is a stepwise approximation to the first analog signal; a second sample-and-hold means for receiving a second analog signal and producing a second sample-and-hold output signal that is a stepwise approximation to the second analog signal; multiplexer means for selecting one of the sample-and-hold output signals, and for producing a multiplexer output signal that is related to the selected sample-and-hold output signal; analog-to-digital converter means for producing a discrete-time digital signal that is representative of the multiplexer output signal; and synchronizing means for synchronizing, to a reference signal, the operation of the first sample-and-hold means and the second sample-and-hold means. In this invention, the synchronizing means comprises D counter means for producing a D counter output signal characterized by a D counter output signal frequency that is equal to the reference signal frequency divided by an integer factor D; time-difference detector means for producing a time-difference detector output signal that is related to the time-difference between corresponding transitions of the D counter output signal and a C counter output signal; integrating amplifier means for producing a sawtooth signal that is related to the time-difference detector output signal, sample-and-hold means for producing sample-and-hold output signal that is related to the sawtooth signal; voltage-controlled oscillator means for producing a VCO output signal characterized by a VCO output signal frequency that is related to the sample-and-hold output signal; Y counter means for producing a Y counter output signal characterized by a Y counter output signal frequency that is equal to the VCO output frequency divided by an integer factor Y; and C counter means for producing a C counter output signal characterized by a C counter output signal frequency that is equal to the Y counter output signal frequency divided by an integer factor C; wherein the Y counter output signal serves to synchronize the operation of the first sample-and-hold means and a second sample-and-hold means.

An object of the present invention is to provide an improved sampling network analyzer in which a phase-locked loop ensures that sampling of one or more input signals is accomplished coherently with an input signal or with an externally-provided reference signal.

Another object of the present invention is to provide an improved sampling network analyzer with independent control of the number of samples per measurement.

Another object of the present invention is to provide an improved sampling network analyzer incorporating a phase-locked loop in which operation over a wide range of frequencies is accomplished utilizing a limited-range voltage controlled oscillator (VCO).

BRIEF DESCRIPTION OF THE DRAWINGS

A complete understanding of the invention may be obtained from the detailed description which follows, together with the accompanying drawings, wherein.

DESCRIPTION OF THE INVENTION

Figure 1:
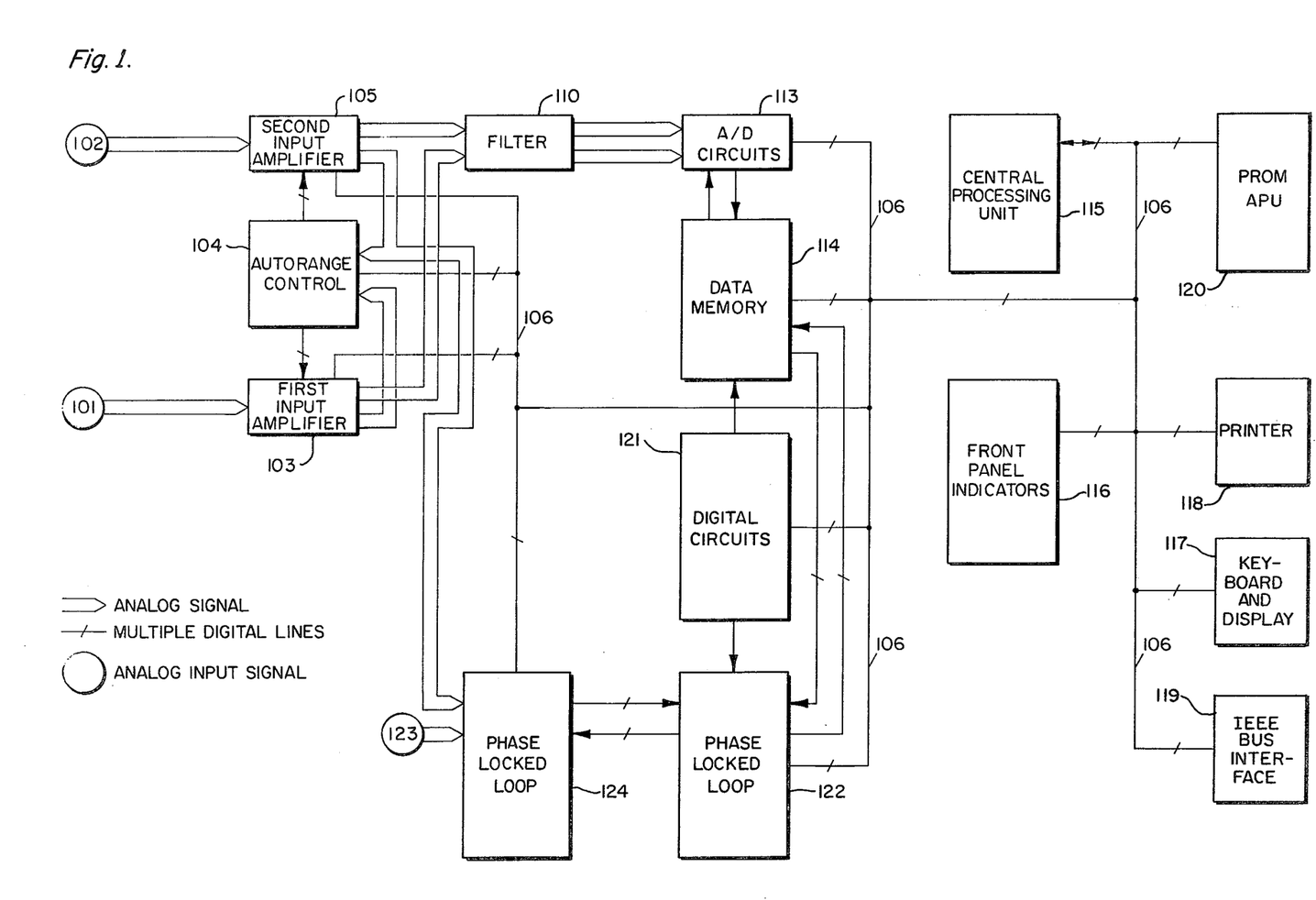
FIG. 1 is a generalized block diagram of a Sampling Network Analyzer according to the present invention.

The present invention may be understood by reference to the illustrative embodiment of FIG. 1. The Sampling Network Analyzer includes first analog input port 101 and second analog input port 102. First analog input port 101 is electrically connected to first input amplifier 103, and second analog input port 102 is electrically connected to second input amplifier 105. Input amplifiers 103 and 105 are variable-gain amplifiers characterized by voltage gain (the ratio of output voltage amplitude to the voltage amplitude of a signal applied to the corresponding input port and resulting in such output voltage amplitude) which can be controlled, or varied, by the autorange control circuits, designated 104 in FIG. 1.

It should be noted that autorange control circuits 104 are electrically connected to the analog outputs of first input amplifier 103 and second input amplifier 105. Autorange control circuits 104 operate or control the voltage gain of first input amplifier 103 and second input amplifier 105 so as to maintain within predetermined limits the amplitude of the signals appearing at the outputs of these amplifiers.

The analog output signals of first input amplifier 103 and second input amplifier 105 are applied to optional filtering means 110. Filtering means 110 serve to provide a controlled frequency-selective filter characteristic in the analog signal paths between input amplifiers 103, 105 and sample-and-hold, multiplexer, and analog-to-digital converter means 113. Usually filtering means 110 will comprise two independent filters, one in each signal path. The amplitude and phase characteristics of the two independent filters are preferably matched one to the other.

The outputs of filtering means 110 are applied to the block designated 113, which contains sample-and-hold, multiplexer, and analog-to-digital converter (ADC) means. The circuitry of 113 serves simultaneously to sample, and hold, the instantaneous output signals of filtering means 110 (or, if optional filtering means 110 are omitted, then the outputs of first input amplifier 103 and second input amplifier 105). The multiplexer portion of 113 selects one of the two sampled signals, and presents the selected sampled signal to an analog-to-digital converter, which serves to convert the signal into digital form. The internal arrangement of the circuitry of 113 is shown in greater detail in FIG. 2, and it will be described in greater detail in the discussion of FIG. 2.

Returning to FIG. 1, analog-to-digital control and data memory means 114 serve to control the sequence of operation of sample-and-hold, multiplexer, and ADC means 113.

The output of sample-and-hold, multiplexer and ADC means 113 is connected to a data bus 106, by means of which the central processing unit (CPU) 115 communicates, in either direction, with various portions of the sampling network analyzer, including sample-and-hold, multiplexer and ADC means 113. Note that central processing unit 115 communicates with data bus 106 in a bi-directional fashion, as is indicated in FIG. 1.

Central processing unit (CPU) 115 also communicates, via data bus 106, with numerous other portions of the sampling network analyzer, namely: autorange control circuits 104, phase-locked loop (PLL) analog circuit means 124, sample-and-hold, multiplexer, and ADC means 113, A/D control and data memory means 114, miscellaneous digital circuits 121, phase-locked-loop (PLL) digital circuits 122, programmable read-only-memory/arithmetic processor unit (PROM/APU) means 120, printer 118, keyboard and display 117, front panel indicators 116, and optional IEEE 488 bus interface means 119.

Phase-locked loop analog circuits 124, as can be seen from FIG. 1, are electrically connected to an external frequency reference input port 123 or the output of the second input amplifier 105. The external frequency reference input port may be supplied an external reference signal which serves to synchronize operation of the sampling network analyzer. Operation of the PLL analog circuits 124 and PLL digital circuits 122 will be described in greater detail in the discussion of FIG. 2.

Figure 2:
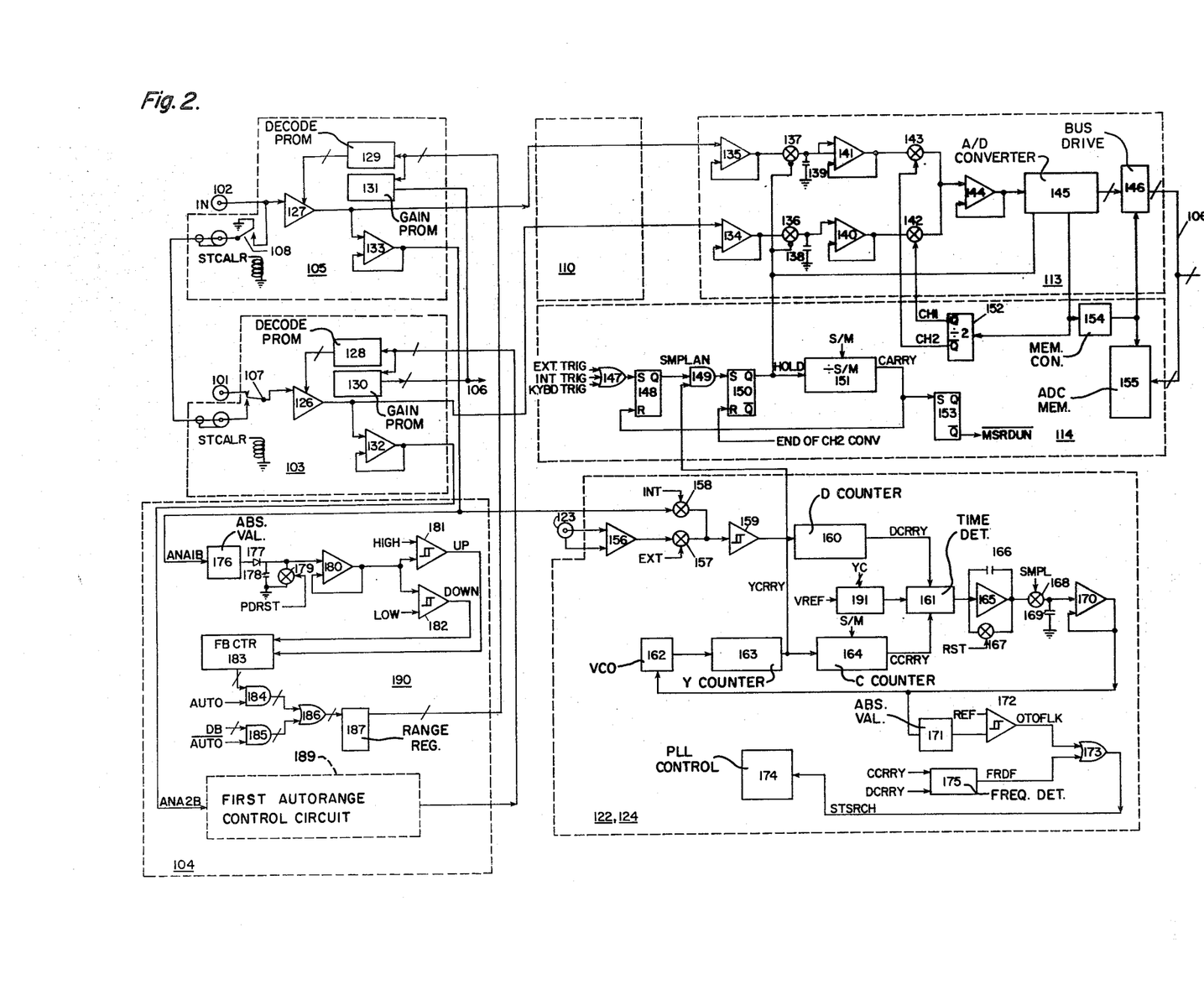
FIG. 2 is a block diagram illustrating, in greater detail than FIG. 1, those portions of the Sampling Network Analyzer that are most relevant to the present invention.

Referring now to FIG. 2, which shows in greater detail many of the components and interconnections depicted schematically in FIG. 1, there appears first analog input port 101 and second analog input port 102, which are connected, respectively, to first variable-gain amplifier 126 and second variable-gain amplifier 127. Note the first input amplifier 103, which appears as a single block in FIG. 1, is shown in FIG. 2, as comprising first variable gain amplifier 126, first gain decoding programmable-read-only memory (PROM) 128, first gain correcting programmable-read-only memory (PROM) 130, and first buffer amplifier 132. The first input signal, applied to first analog input port 101, is routed via first calibration relay 107 to the input of first variable gain amplifier 126. The output of first variable gain amplifier 126 is electrically connected to first buffer amplifier 132 and to filtering means 110. The output of first buffer amplifier 132 is supplied to the autorange control circuits 104 and, in particular, to the first autorange control circuit 189. First gain decoding PROM 128, which is electrically connected so as to control the voltage gain of first variable gain amplifier 126 is, in turn, controlled by first autorange control circuit 189, as can be seen from FIG. 2. First gain correcting PROM 130, which is also fed from first autorange control circuit 189, serves to provide a correction for any inaccuracy of the gain control characteristic of first variable-gain amplifier 126.

It is the function of first gain correcting PROM 130 that is central to one of the embodiments of the present invention. Basically, the system operates as follows. First autorange control circuit 189, which is responsive to the output signal first buffer amplifier 132, operates via first gain decoding PROM 128 to vary the voltage gain of first variable amplifier 126 in order to maintain the output of first buffer amplifier 132 (and hence the output of first variable-gain amplifier 126) within certain predetermined limits. If first autorange control circuit 189 senses that the output voltage amplitude of first buffer amplifier 132 is, for example, too great, first autorange control circuit 189 then operates (via first gain decoding PROM 128) to reduce the voltage gain of first variable-gain amplifier 126 to the next lower voltage gain of a predetermined set of voltage gains. This sequence continues until the amplitude of the output of first buffer amplifier 132 is within the range of acceptable output voltage amplitudes.

Because the actual voltage gain of first variable amplifier 126 will, in general, depart from perfect accuracy, the present invention utilizes first gain correcting PROM 130 to introduce into the system a correction for such departure. In final test of the sampling network analyzer, the departure of the actual voltage gains of first variable-gain amplifier 126 are accurately measured, as a function of the requested or prescribed voltage gain, and digital words representing the departure of actual voltage gain from requested or prescribed voltage gain are programmed into the first gain correcting PROM 130. In this way, when first autorange control circuit 189 commands a particular gain (via first gain decoding PROM 128), the command signal is also applied, as an address, to first gain correcting PROM 130. First gain correcting PROM 130 then provides, to the sampling network analyzer, a data word representing the appropriate gain correction factor. The correction, of course, is unique to the particular sampling network analyzer, or, rather, to the particular first variable gain amplifier 126, and it is the same correction as was measured in final test of that particular sampling network analyzer. Thus, to the extent that voltage gain errors are a consequence of component errors which remain fixed, or at least do not vary substantially after final test of a given system, the data stored in first gain correcting PROM 130 serves to provide an accurate correction to the instrument.

Second input amplifier 105 is shown, in FIG. 2, in similar detail. Second input amplifier 105 includes second analog input port 102 which is electrically connected to second variable-gain amplifier 127. The output of second variable-gain amplifier 127 is applied to filtering means 110, and also to the input of second buffer amplifier 133. The output of second buffer amplifier 133 is applied to second absolute value circuit 176 which, along with second diode 177, second peak holding capacitor 178, second reset switch 179, ninth buffer amplifier 180, third Schmitt trigger 181, fourth Schmitt trigger 182, feedback counter 183, second two-wide AND gate 184, third two-wide AND gate 185, second two-wide OR gate 186 and range register 187, constitute second autorange control 190. These enumerated components are, of course, duplicated in first autorange control circuit 189, which was previously discussed in general terms. Now, in connection with the operation of the second channel, the internal functioning of second autorange control circuit 190 will be described.

Second absolute value circuit 176 provides an output that is related to the absolute value of its input, i.e., the output of first buffer amplifier 132. Basically, second absolute value circuit 176 is a full-wave rectifier type circuit. Diode 177 serves to capture onto second peak holding capacitor 178, the positive peak of the output of second absolute value circuit 176. Second reset switch 179 operates to discharge, or reset, second peak holding capacitor 178 in response to an external logic signal (designated PDRST in FIG. 2). Ninth buffer amplifier 180, having its input connected to second peak holding capacitor 178, responds to the voltage stored on second peak holding capacitor 178 and provides a low-impedance output signal substantially identical to such voltage. The output of ninth buffer amplifier 180 is applied to one input of third Schmitt trigger 181. The other input of third Schmitt trigger 181 is fed from a threshold voltage, denominated "HIGH" in FIG. 2. When the voltage at the output of ninth buffer amplifier 180 exceeds the reference voltage "HIGH," the output of third Schmitt trigger 181 goes to a logic 1, causing forward-backward counter 183 to increment in a first direction.

Similarly, the output of ninth buffer amplifier 180 is also applied to an input of fourth Schmitt trigger 182. The other input of fourth Schmitt trigger 182 is supplied from a reference voltage designated "LOW" in FIG. 2. When the output voltage from ninth buffer amplifier 180 falls below the reference voltage "LOW," the output of fourth Schmitt trigger 182 assumes a logic 1 condition, causing forward-backward counter 183 to decrement, i.e., to count in a direction opposite to that corresponding to a logic 1 from third Schmitt trigger 181. In this way, forward-backward counter 183 is made to count in one direction or another if the output of ninth buffer amplifier 180 is outside voltage limits established by the reference voltages "HIGH" and "LOW."

The output of forward-backward counter 183, which is a parallel digital word, is logically combined, with various other signals not relevant to the present invention, in second two-wide AND gate 184, third two-wide AND gate 185, and second two-wide OR gate 186, and applied to second range register 187. Basically, second range register 187 contains the information that controls the voltage gain of second variable gain amplifier 127 via second gain decoding PROM 129.

It is important to note that the output of range register 187 is also applied, as an address, to second gain correcting PROM 131, in which are stored the correction factors (measured in final test of the particular system) appropriate to second variable-gain amplifier 127. In this way, when range register 187 requests a particular voltage gain of second variable-gain amplifier 127, second gain correcting PROM 131 provides, via data bus 106, a digital word that represents the appropriate correction for gain inaccuracy of second variable-gain amplifier 127 at the particular voltage gain requested. As was discussed in connection with first input amplifier 103, accurate measurements of the midband voltage gain, and low- and high-frequency response characteristics, of second variable-gain amplifier 127 are made in final test of the sampling network analyzer and "burned in" or otherwise stored in second gain correcting PROM 131.

The internal details of S-H/MUX/ADC (sample-and-hold, multiplexer and analog-to-digital converter) 113 are shown in FIG. 2.

In particular, third buffer amplifier 134 receives the output of first variable-gain amplifier 126, via optional filtering means 110. Similarly, fourth buffer amplifier 135 receives, also via filtering means 110, the output of second variable-gain amplifier 127. The output of third buffer amplifier 134 is applied to first sampling gate 136, and thence to first hold capacitor 138. First sampling gate 136 and first hold capacitor 138 constitute a sample-and-hold (S-H) circuit. Fifth buffer amplifier 140, which is electrically connected to first hold capacitor 138, serves to provide a low-impedance output voltage that is substantially equal to the voltage stored on first hold capacitor 138.

In a similar fashion, the output of fourth buffer amplifier 135 is applied, via second sampling gate 137, to second hold capacitor 139. Sixth buffer amplifier 141, having an input which is electrically connected to second hold capacitor 139, serves to provide a low-impedance output voltage that is substantially equal to the voltage stored on second hold capacitor 139.

The outputs of fifth buffer amplifier 140 and sixth buffer amplifier 141 are applied, via first multiplexer switch 142 and second multiplexer switch 143, respectively, to seventh buffer amplifier 144. First multiplexer switch 142, second multiplexer switch 143, and seventh buffer amplifier 144, in combination, constitute an analog multiplexer circuit which serves to select one or the other of the outputs of fifth buffer amplifier 140 and sixth buffer amplifier 141, and present the selected output to the analog-to-digital converter (ADC) 145. ADC 145 operates to convert the analog signal, that is, the output signal of seventh buffer amplifier 144, to a parallel digital signal, which is applied, via bus drivers 146, to the data bus 106.

It is helpful at this point to review the operation of S-H/MUX/ADC 113. Basically, the sample-and-hold portion, comprising first sampling gate 136, first hold capacitor 138, and fifth buffer amplifier 140; and, fourth buffer amplifier 135, second sampling gate 137, second hold capacitor 139, and sixth buffer amplifier 141, operates to sample (simultaneously) the two analog signals presented to the inputs of third buffer amplifier 134 and fourth buffer amplifier 135. These signals are, of course, the outputs of filtering means 110 or, if optional filtering means 110 are not included, then the outputs of first variable gain amplifier 126 and second amplifier 127. In general, in a sampling network analyzer of the type under consideration, it is important that the two signals be sampled simultaneously; time skew between the effective sampling times of the two channels must be minimized.

First multiplexer switch 142, second multiplexer switch 143, and seventh buffer amplifier 144, constitute a two-wide analog multiplexer. This circuit serves to select one of the two outputs of fifth buffer amplifier 140 or sixth buffer amplifier 141 and present the selected output to the analog input of ADC 145. ADC 145 operates to provide a parallel digital signal that is representative of the output of seventh buffer amplifier 144. This digital representaton is applied, via bus drivers 146, to data bus 106.

In this way, the two analog input signals, i.e., the signals applied to the input of third buffer amplifier 134 and fourth buffer amplifier 135, are sampled at substantially the same instant, held and then sequentially converted into digital representations which are (sequentially) applied to data bus 106.

The operation of the various components of S-H/MUX/ADC 113 is under the control of ADC control and data memory 114 as can be seen from FIG. 2. The details of the operation of ADC control and data memory 114 will be apparent, from FIG. 2, to one familiar with the art of digital electronic control circuitry. A description of the operation of ADC control and data memory 114 is as follows.

Various trigger signals are logically combined, via three-wide OR gate 147, and applied to the SET input of first SET-RESET flip-flop 148. The Q output of first SET-RESET flip-flop 148 is applied to one input of first two-wide AND gate 149 whose output is, in turn, applied to the SET input of second SET-RESET flip-flop 150. The Q output of second SET-RESET flip-flop 150 serves to operate first sampling gate 136 and second sampling gate 137 in S-H/MUX/ADC 113. It is important to note that the operation of sampling gates 136 and 137 is ultimately synchronized to the logic signal YCRRY, the output of Y counter 163, which is introduced via first two-wide AND gate 149. The Q output of second SET-RESET flip-flop 150 is also applied to the hold input of the first preset counter 151.

As can be seen from FIG. 2, first preset counter 151 is preset with an integer corresponding to the desired number of samples per measurement. The carry output of preset counter 151 is applied to the SET input of third SET-RESET flip-flop 153 and also to the RESET input of first SET-RESET flip-flop 148. ADC memory 155 is controlled by memory control 154 (which also serves to control bus drivers 146 in S-H/MUX/ADC means 113. ADC memory 155 also communicates with data bus 106, under the control of memory control 154.

A logic signal marking the end of channel two conversion is applied to the RESET input of second SET-RESET flip-flop 150 and serves to reset this flip-flop upon the conclusion of the channel two conversion sequence.

Divide-by-two flip-flop 152, having its complementary outputs connected to first multiplexer switch 142 and second multiplexer switch 143, serves to operate these switches alternately so that first one, then the other, of the outputs of fifth buffer amplifier 140 and sixth buffer amplifier 141 are presented to seventh buffer amplifier 144.

Turning now to the detailed illustration in FIG. 2 of the PLL digital circuits 122 and PLL analog circuits 124, it can be seen that external reference frequency input port 123 is electrically connected to an external frequency reference input amplifier 156, whose output is applied, via third multiplexer switch 157, to first Schmitt trigger 159. Also applied, via fourth multiplexer switch 158, to the input of first Schmitt trigger 159, is the output of second buffer amplifier 133 in second input amplifier 105. By actuating one or the other of multiplexer switches 157 and 158, the sampling network analyzer can be synchronized to either an external reference frequency (applied to external reference frequency input port 123), or to the signal applied to the second analog input port 102. The output of first Schmitt trigger 159 is applied to D counter 160, which is a preset counter that is arranged so as to divide by the integer factor D. DCRRY, the carry output of D counter 160, is applied to one input of time difference detector 161. Applied to the other input of time difference detector 161 is CCRRY, the carry output of C counter 164, which is a preset counter arranged to divide by the integer factor C which is equal to the desired number of samples per measurement (S/M). A voltage reference, generated by first digital-to-analog (DAC) converter means 191, is supplied to time-difference detector 161 in order to program its calibration factor. That is, a given time difference (between corresponding transistions of the logic signals CCRRY and DCRRY, produces output current, from time difference director 161, that is directly proportional to the voltage applied, by first DAC 191, to time difference detector 1611. The output voltage from first DAC 191 is, in turn, controlled by a digital word, designated YC in FIG. 2. In this way, the sampling network analyzer is able to control the gain factor of the phase-locked loop to keep a constant loop gain despite varying synchronization frequencies.

Figure 4:
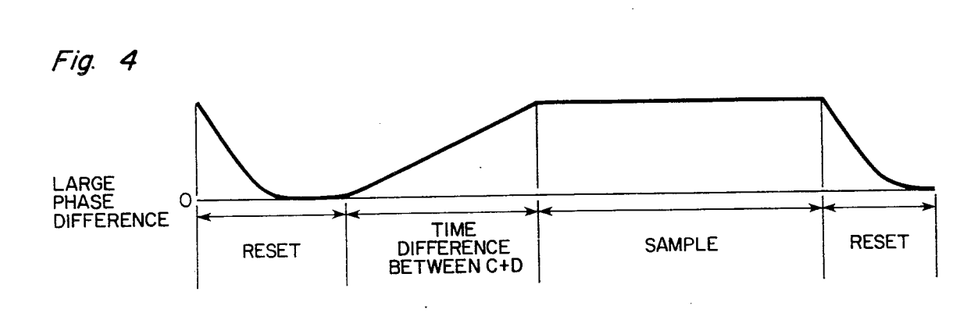
FIGS. 4 and 5 show the voltage waveform appearing at the output of operational amplifier 165 for the conditions of large phase difference, and small phase difference, respectively, between the logic signals CCRRY and DCRRY.
Figure 5:
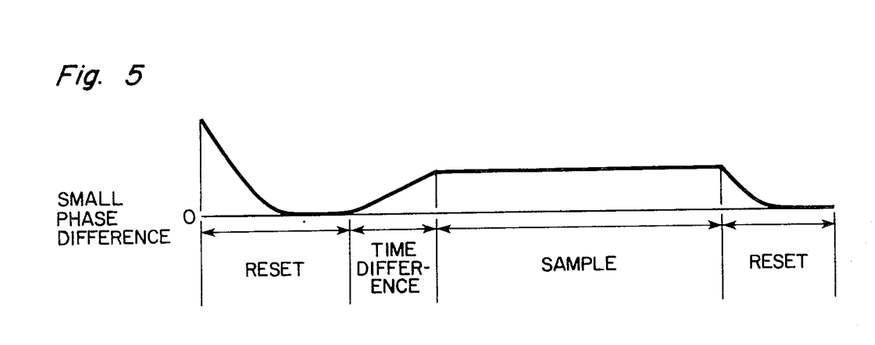

The output of time difference detector 161 is a current whose duration is equal to the time difference between corresponding transitions of the logic signals CCRRY and CCRRY, and whose amplitude is proportional to the voltage produced by first DAC 191. This current is applied to the summing junction of operational amplifier 165. There is provided an integrating capacitor 166, connected output-to-input of amplifier 165, and first reset switch 167 is connected across integrating capacitor 166 to provide a reset function. The sequence of operation of these components is illustrated in FIGS. 4 and 5. First, reset switch 167 closes for a predetermined interval of time to discharge integrating capacitor 166. First reset switch 167 is then opened and the circuit comprising operational amplifier 165 and integrating capacitor 166 functions as a Miller integrator to produce, at the output of operational amplifier 165, a ramp voltage having a slope proportional to the voltage produced by first DAC 191, and a duration related to the time difference between corresponding transitions of the logic signals CCRRY and DCRRY.

Third sampling gate 168, which is electrically connected to the output of operational amplifier 165, then operates to charge third hold capacitor 169 to substantially the same voltage as appears at the output of operational amplifier 165 at the conclusion of the ramp interval. Third sampling gate 168 then opens, so that third hold capacitor 169 retains a charge, and hence a voltage, corresponding to that voltage that existed at the output of operational amplifier 165 at the conclusion of the ramp interval. Eighth buffer amplifier 170 is electrically connected to third hold capacitor 169 in order to provide a low impedance output voltage that is substantially identical to the voltage stored on third hold capacitor 169. The output voltage of eighth buffer amplifier 170 is applied to the control input of voltage-controlled oscillator 162, which serves to provide, at its output, a logic signal at a frequency that is substantially proportional to the voltage applied to its control input, in other words, to the output voltage of eighth buffer amplifier 170.

It is the output of voltage-controlled oscillator 162 that serves as input to Y counter 163. Y counter 163 is a preset counter arranged to divide frequencies by the integer factor Y. YCRRY, output of Y counter 163, serves as input to C counter 164, and it also serves to synchronize the operation of first sampling gate 136 and second sampling gate 137, as can be seen in FIG. 2.

It will be recognized that the various elements recited above constitute a phase-locked loop, in which the output of a voltage-controlled oscillator 162 is divided, first by a factor Y (in Y counter 163), then by a factor C (in C counter 164), and applied to one input of a time-difference detector 161. A reference signal is divided by a factor D (in D counter 160) and applied to the other input of time-difference detector 161. The output of time-difference detector 161 is processed, via a Miller integrator and sample-and-hold, and fed back to control the frequency of voltage-controlled oscillator 162. It will be recognized that this type of loop, when frequency lock is achieved, will produce at the output of C counter 164 a frequency given by:

$$f = (fs/C) = (fi/D),$$

where fs is the sampling frequency, that is the frequency of the logic signal YCRRY at the output of Y counter 163; and fi is the frequency of the signal applied to first Schmitt trigger 159, that is, the frequency of the reference signal against which synchronization is to be effected. The sampling frequency fs can thus be seen to be a fraction that is the ratio of two integers (C and D) times the reference frequency fi. In general, the factor C, that is, the factor pre-set into C counter 164, is determined by the desired number of samples per measurement. The factor D, preset into D counter 160, serves merely to divide the reference frequency in those situations where the reference frequency is too high to permit the desired number of samples per measurement within a single period of the reference frequency. In such cases, the desired number of samples per measurement occurs over an integral number of periods of the reference frequency as determined by the factor D.

The Y counter 163 serves a somewhat different function. Basically, Y counter 163 is provided in order to permit limiting the range of frequency that must be provided by voltage-controlled oscillator 162. In other words, depending upon the input frequency F and the desired number of samples per measurement, the factor Y is chosen such that the frequency of voltage-controlled oscillator 162 is within, for example, plus or minus 10% of some nominal center frequency. In this way, the Sampling Network Analyzer can be made to operate over a frequency range spanning many decades, while utilizing a limited-range VCO. The limited range VCO will, in general, provide lower noise than would a wide-range VCO.

It will be recognized that a phase-locked loop, such as described above, will be characterized by an open-loop gain that is related to the frequency of the signals applied to time-difference detector 161, among other variables. First DAC 191 is included in order to counter the effects of this varying open-loop gain. First DAC 191 provides, to time-difference detector 161, a reference voltage that is proportional to the frequency of the phase-locked loop, thus providing more nearly uniform loop dynamics, despite varying reference frequencies.

First absolute value circuit 171, whose input is connected to the output of eighth buffer amplifier 170, serves to provide an output that is related to the absolute value of the instantaneous voltage appearing at the output of eighth buffer amplifier 170. The output of first absolute value circuit 171 is, in turn, applied to one input of second Schmitt trigger circuit 172, the other input of which is supplied a voltage reference. This circuit basically serves to determine whether the output voltage of eighth buffer amplifier 170 is within certain predetermined bounds, thereby indicating whether the phase-locked loop has achieved lock and, if so, whether the lock frequency is within an acceptable range of frequencies for the voltage-controlled oscillator 162. The output of second Schmitt trigger 172 is logically combined, via first two-wide OR gate 173, with the output of frequency-difference detector 175, to produce a logic signal which is supplied to PLL control circuits 174. Basically, the operation of these last-mentioned circuits is to detect an out-of-lock condition and to insure that the phase-locked loop is always operating within an appropriate range of frequencies for the voltage controlled oscillator 162.

Figure 3:
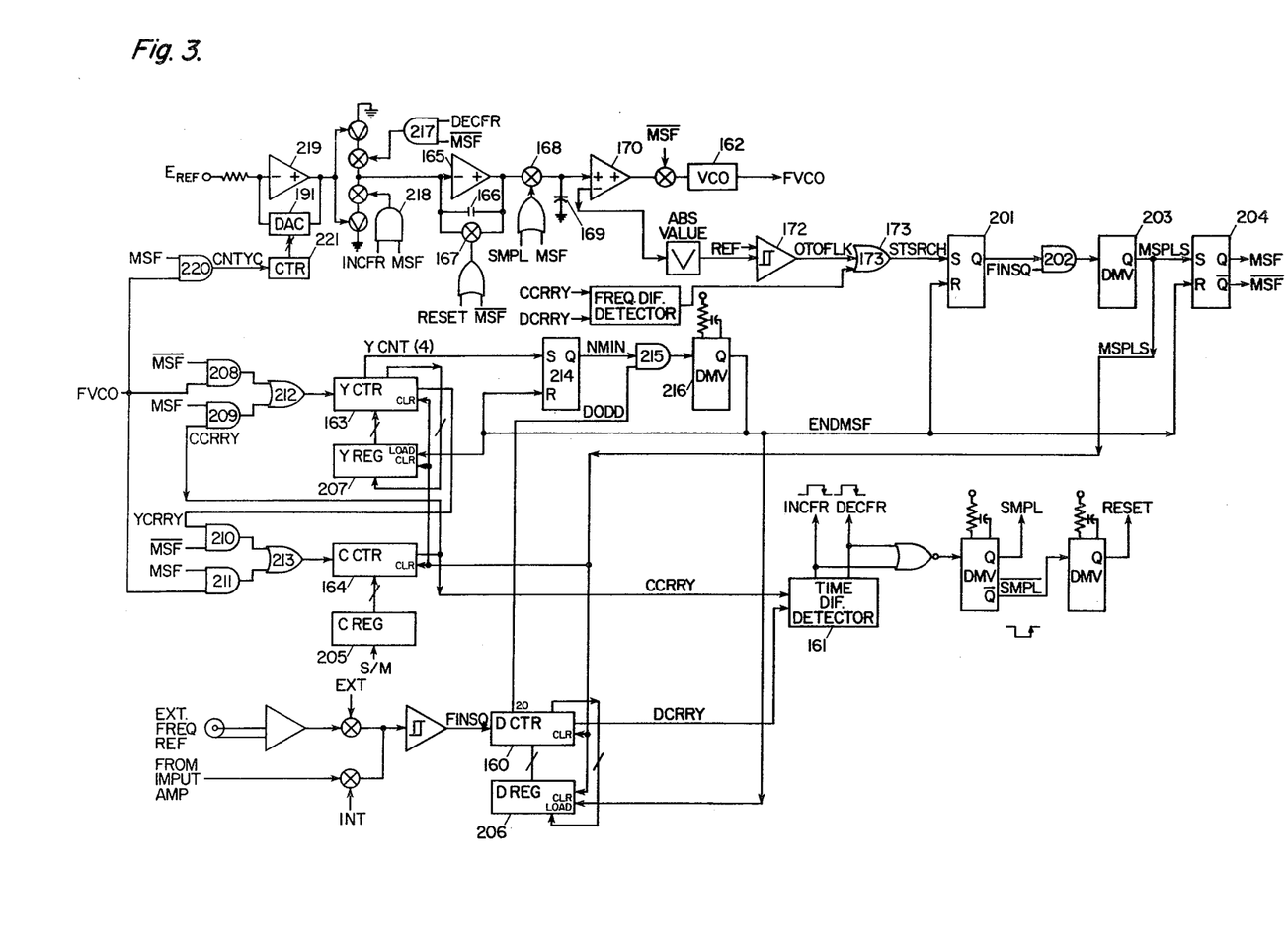
FIG. 3 shows, in even greater detail than the block diagram of FIG. 2, the phase-locked-loop portions of the sampling network analyzer. In particular, FIG. 3 serves to illustrate the manner in which the various integer factors (divisors) are preset into C register 205, D register 206, and Y register 207.

FIG. 3 shows, in somewhat greater detail, the internal arrangement of PLL digital circuits 122 and PLL analog circuits 124 shown schematically in FIG. 2. In particular, FIG. 3 is included to illustrate the way in which the factors C, D, and Y are determined and set into the C counter 164, D counter 160 and Y counter 163.

Note that the mnemonics MSF and MSF, shown in FIG. 3, refer to logic signals for the "measure frequency" mode of the Sampling Network Analyzer, in which mode the factors D and Y are determined and set into D register 206 and Y register 207, respectively.

In FIG. 3, it can be seen that first two-wide OR gate 173 combines the out of lock logic signal OTOFLK, which serves to indicate that VCO 162 has been driven beyond a predetermined acceptable range of frequencies, and a logic signal generated by frequency-difference detector 175, which is an indicator that the inputs to time-difference detector 161 are not at the same frequency. This latter signal, produced by frequency-difference detector 175, is required because it is possible for the system to "lock" in a mode such that the inputs to the time-difference detector 161 are harmonically related; i.e., there can be a "false lock" condition, where the inputs to the time-difference detector are at different frequencies where one such frequency is an integer multiple or sub-multiple of the other. Frequency-difference detector 175 serves to detect this condition, and to provide a logic one input to first two-wide OR gate 173.

The output of first two-wide OR gate 173, designated by the mnemonic STSRCH for "start search," is applied to the set input of fourth set-reset flip-flop 201. In other words, when an out-of-lock condition is detected, either as a result of the VCO 162 being driven outside its predetermined acceptable range of frequencies, or in the situation where a harmonic lock condition is detected by frequency-difference detector 175, a "start search" process is inititd; the Q output of fourth set-reset flip-flop 201 goes to a logic 1.

The Q output of fourth set-reset flip-flop 201 is applied, via fourth two-wide AND gate 202, to first delay multivibrator 203, which generates the master set pulse (mnemonics "MSPLS"), which serves to clear C counter 164, D counter 160, and Y counter 163. This same signal, MSPLS, also operates to clear D register 206 and Y register 207. Note that C register 205 is set directly by the desired samples per measurement ("S/M") and is not reset by the MSPLS logic signal.

The MSPLS signal is also applied to the set input of fifth set-reset flip-flop 204, whose outputs Q and $\overline{Q}$ generate the MSF and $\overline{MSF}$ logic signals. MSF remains at a logic 1 and $\overline{MSF}$ remains at a logic zero throughout the measure frequency sequence.

It will be recognized by those skilled in the art that fifth two-wide AND gate 208, sixth two-wide AND gate 209, and third two-wide OR gate 212 constitute a two-input multiplexer, which serves to select either of the signals FVCO or CCRRY, and apply the selected signal to the clock input of Y counter 163. The selection of either FVCO or CCRRY is determined by whether MSF or $\overline{MSF}$ is high. In the "measure frequency" mode (i.e., MSF high), CCRRY is selected and applied to the clock input of Y counter 163.

Similarly, it will be recognized that seventh two-wide AND gate 210, eighth two-wide AND gate 211, and fourth two-wide OR gate 213 also constitute a two-input multiplexer which selects either: YCRRY or FVCO, depending on the state of MSF, and applies the selected logic signal to the clock input of the C counter 164. In the "measure frequency" mode (i.e., MSF high), FVCO is applied to the clock input of C counter 164.

It is apparent that in the "measure frequency" mode C counter 164 serves to count FVCO, i.e., the output of VCO 162, and the carry output of C counter 164 (CCRRY) is applied to the clock input of Y counter 163. The fourth bit of Y counter 163, designated by the mnemonic YCNT(4) is applied to the set input of sixth set-reset flip-flop 214, the Q output of which (designated by the mnemonic NMIN) is applied, via ninth two-wide AND gate 215, to the input of second delay multivibrator 216. The Q output of second delay multivibrator 216 serves to load, into Y register 207, the count existing in Y counter 163, and into D register 206, the count existing in D counter 160. It will also be noted, in FIG. 3, that the Q output in second delay multivibrator 216, is applied to the reset input of fifth set-reset flip-flop 204, thereby terminating the "measure frequency" sequence.

It is important to note that, during the "measure frequency" sequence, the VCO 162 is maintained at its center, or nominal frequency. This is accomplished by tenth two-wide AND gate 217 and eleventh two-wide AND gate 218, which serve to override the "increase frequency" (INCFR) and "decrease frequency" (DECFR) signals from time-difference detector 161. One input of each of the two-wide AND gates 217 and 218 is supplied the logic signal $\overline{MSF}$ which, of course, is at a logic zero throughout the "measure frequency" interval. As can be seen from FIG. 3, the MSF and $\overline{MSF}$ are introduced at additional points in the frequency control chain to further ensure that VCO 162 operates at its center, or nominal, frequency during the "measure frequency" interval.

Therefore, during the "measure frequency" sequence, the following events occur:

1. The voltage-controlled oscillator 162 is set to its nominal or center frequency by the operation of two-wide AND gates 217 and 218 (among other control paths);

2. The output of voltage-controlled oscillator 162, FVCO, is applied to C counter 164, which operates to divide the frequency of voltage-controlled oscillator 162 by the desired numbeer of samples per measurement, and so produce an output (CCRRY) at a frequency equal to FVCO divided by the desired number of samples per measurement;

3. Y counter 163 then counts to at least 16 (YCNT(4)=1);

4. When the Y counter 163 reaches a count of 16, sixth set-reset flip-flop 214 is set;

5. Then, if the count in D counter 160 is odd, (DODD=1), delay multivibrator 216 operates to load into Y register 207 the count achieved by Y counter 163 during the "measure frequency" sequence;

6. At this same time, the count achieved during the "measure frequency" sequence by D counter 160 is loaded into D register 206.

7. In this way, the "measure frequency" sequence is terminated when the Y counter 163 achieves a count of at least 16 and the count in D counter 160 is odd. The Y counter 163 is then programmed to divide by the count achieved (by Y counter 163) during the "measure frequency" sequence, and the D counter 160 is programmed to divide by the count achieved (by D counter 160) during the "measure frequency" sequence. At this point, the "measure frequency" sequence is terminated, fifth set-reset flip-flop 204 is reset by the signal "ENDMSF" ("end measure frequency"), generated at the Q output of second delay multivibrator 216, the input of the C counter 164 is returned to YCRRY, the carry output of Y counter 163, voltage-controlled oscillator 162, and the input of Y counter 163 is returned to FVCO, the output of VCO 162.

The result of this sequence of events is that when the Sampling Network Analyzer is returned from the "measure frequency" sequence to operate as a Sampling Network Analyzer, the following situation obtains:

1. The integer factor C, preset into C register 205, serves to establish the desired number of samples per measurement, the Y counter 163, which was programmed in the "measure frequency" sequence to divide by a factor Y preset into Y register 207, provides an output (YCRRY) that operates sampling gates 136 and 137 (in FIG. 2). The logic signal YCRRY also serves as input to C counter 164.

2. The D counter 160 is programmed to divide the reference frequency by an odd integer factor D (which factor may be as low as unity) such that, for the selected values of the integer factors Y and C, the sampling rate, i.e., the frequency of the signal YCRRY, does not exceed the maximum sampling rate established by S/H multiplexer and ADC circuitry 113.

3. FIGS. 4 and 5 show the waveforms appearing at the output of operational amplifier 165, in FIG. 3, for the conditions of large phase error and small phase error, respectively, between the signals CCRRY and DCRRY applied to the inputs of time-difference detector 161. As can be seen from FIGS. 4 and 5, in each instance there is an initial "reset" interval, during which first reset switch 167 discharges integrating capacitor 166. Refer to, for example, FIG. 3. At the conclusion of the reset time, the output of operational amplifier 165 ramps at a rate determined by the voltage supplied by first DAC 191. The time interval during which the output of operational amplifier 165 ramps at this rate is determined by the time difference between the signals CCRRY and DCRRY. For a greater time difference, the ramp is of longer duration and hence the voltage reaches a higher value. At the conclusion of the ramp interval, the voltage is held for an interval designated "sample," during which interval it is transferred, via third sampling gate 168, to third hold capacitor 169. Following the "sample" interval, first reset switch 167 is again closed to reset integrating capacitor 166. The cycle then repeats.

In this way, the voltage applied to voltage-controlled oscillator 162, that is, the output voltage of eighth buffer amplifier 170, is made to be substantially dc, with a minimum of ripple caused by the time-difference detection process. It will be obvious to those skilled in the art that ripple components at the input of voltage-controlled oscillator 162 must be minimized in order to minimize extraneous frequency modulation of voltage-controlled oscillator 162 and hence to minimize spurious components appearing at the output of voltage-controlled oscillator 162.

It will also be recognized that the dynamic behavior of a phase-locked loop, such as that shown in FIG. 3, will be a function of the loop frequency, i.e., the frequency of the signals CCRRY and DCRRY applied to the inputs of time-difference detector 161, unless some measures are taken to compensate for the fact that loop gain will inherently vary with the frequency of these signals (CCRRY and DCRRY).

Basically, first DAC 191 is connected as a feedback element around second operational amplifier 219. The summing junction of second operational amplifier is fed a fixed current from a reference voltage, as can be seen in FIG. 3. In this way, the output voltage of second operational amplifier 219 is made to vary inversely with the digital word presented to first DAC 191. During the "frequency measure interval," FVCO is applied, via eleventh two-wide AND gate 220, to the input of counter 221, so that counter 221 stores a count that is proportional to the time during which MSF is at a logic 1 condition. As previously discussed, FVCO is fixed at its nominal, center frequency during the "measure frequency" sequence.

The duration of the "measure frequency" interval, and hence the count stored in counter 221, is related to the frequencies CCRRY and DCRRY, by virtue of the sequence of events that occurs during the "frequency measure" interval. In this way, the output voltage of second operational amplifier 219 is made to vary inversely with the frequency of the signals CCRRY and DCRRY, thereby maintaining a substantially constant loop gain independent of the reference frequency and the samples per measurement parameter set into C register 205.

It will be understood by those skilled in the art that many modifications and variations of the present invention may be made without departing from the spirit and scope thereof.

What is claimed is:

1. An improved sampling network analyzer of the type having:
   (a) first sample-and-hold means for receiving a first analog signal and for producing a first sample-and-hold output signal that is a stepwise approximation to the first analog signal;
   (b) analog-to-digital converter means, electrically connected to the first sample and hold means, the analog-to-digital converter means for receiving the first sample and hold output signal and for producing a discrete-time digital signal that is representative of the first sample and hold output signal;
   (c) synchronizing means, electrically connected to the first sample-and-hold means, the synchronizing means for receiving a reference signal, characterized by a reference signal frequency, and for synchronizing, to the reference signal, operation of the first sample-and-hold means;
wherein the synchronizing means comprises:
   (d) time-difference detector means, electrically connected to a C counter means, the time difference detector means for producing a time difference detector output signal that is related to time difference between corresponding transitions of the reference signal and a C counter output signal;
   (e) integrating amplifier means, electrically connected to the time difference detector means, the integrating amplifier means for receiving the time difference detector output signal and for producing a sawtooth signal that is related to an integration, with respect to time, of the time difference detector output signal;
   (f) third sample-and-hold means, electrically connected to the integrating amplifier means, the third sample-and-hold means for receiving the sawtooth signal and for producing a third sample-and-hold output signal that is related to the sawtooth signal;
   (g) voltage-controlled oscillator means, electrically connected to the third sample-and-hold means, the voltage-controlled oscillator means for receiving the third sample-and-hold output signal and for producing a VCO output signal characterized by a VCO output signal frequency that is related to the third sample-and-hold output signal;
   (h) Y counter means, electrically connected to the voltage-controlled oscillator means, the Y counter means for receiving the VCO output signal and for producing a Y counter output signal, the Y counter output signal characterized by a Y counter output signal frequency that is equal to the VCO output signal frequency divided by an integer factor Y;
   (i) C counter means, electrically connected to the Y counter means, the C counter means for receiving the Y counter output signal and for producing a C counter output signal that is characterized by a C counter output signal frequency that is equal to the Y counter output signal frequency divided by an integer factor C;
wherein the Y counter output signal serves to synchronize, to the reference signal, operation of the first sample-and-hold means.

2. An improved sampling network analyzer as recited in claim 1, wherein the synchronizing means further comprises:
(a) D counter means, electrically connected intermediate the reference signal and the time-difference detector means, the D counter means for receiving the reference signal, and for producing a D counter output signal characterized by a D counter output signal frequency that is equal to the reference signal frequency divided by an integer factor D, and for applying the D counter output signal to the time-difference detector means.

3. An improved sampling network analyzer as recited in claim 2, in which the integer factor D is an odd integer.

4. An improved sampling network analyzer as recited in claim 2, further comprising means for establishing the integer factor D such that an appropriate time interval is provided between successive operations of the first sample-and-hold means, the appropriate time interval being sufficient but not substantially in excess of that required for functioning of the first sample-and-hold means and the analog-to-digital converter means.

5. An improved sampling network analyzer as recited in claim 4, in which the integer factor D is an odd integer.

6. An improved sampling network analyzer as recited in claim 1, wherein the synchronizing means further comprises:
(a) means, electrically connected to the C counter means and operable by an operator of the sampling network analyzer, for establishing the integer factor C in accordance with a desired number of samples per measurement.

7. An improved sampling analyzer as recited in claim 6, wherein the synchronizing means further comprises:
(a) means, electrically connected to the Y counter means, for establishing the integer factor Y such that operation of the voltage-controlled oscillator means is maintained within a substantially narrow range of frequencies notwithstanding variations in the integer factor C.

8. An improved sampling network analyzer as recited in claim 1, wherein the synchronizing means further comprises:
(a) means, electrically connected to the Y counter means, for establishing the integer factor Y such that operation of the voltage-controlled oscillator means is maintained within a substantially narrow range of frequencies notwithstanding substantially wide variations in the frequency of the reference signal.

9. An improved sampling network analyzer of the type having:
(a) first sample-and-hold means for receiving a first analog signal and for producing a first sample-and-hold output signal that is a stepwise approximation to the first analog signal;
(b) second sample-and-hold means for receiving a second analog signal and for producing a second sample-and-hold output signal that is a stepwise approximation to the second analog signal;
(c) multiplexer means, electrically connected to the first sample-and-hold means and to the second sample-and-hold means, the multiplexer means for receiving the first sample-and-hold output signal and the second sample-and-hold output signal, for selecting one of such sample-and-hold output signals, and for producing a multiplexer output signal that is related to such selected sample-and-hold output signal;
(d) analog-to-digital converter means, electrically connected to the multiplexer means, the analog-to-digital converter means for receiving the multiplexer output signal and for producing a discrete-time digital signal that is representative of the multiplexer output signal;
(e) synchronizing means, electrically connected to the first sample-and-hold means and to the second sample-and-hold means, the synchronizing means for receiving a reference signal, characterized by a reference signal frequency, and for synchronizing, to the reference signal, operation of the first sample-and-hold means and the second sample-and-hold means;

wherein the synchronizing means comprises:
(f) D counter means, for receiving the reference signal and for producing a D counter output signal characterized by a D counter output signal frequency that is equal to the reference signal frequency divided by an integer factor D;
(g) time difference detector means, electrically connected to the D counter means and to a C counter means, the time difference detector means for producing a time difference detector output signal that is related to time difference between corresponding transitions of the D counter output signal and a C counter output signal;
(h) integrating amplifier means, electrically connected to the time difference detector means, the integrating amplifier means for receiving the time difference detector output signal and for producing a sawtooth signal that is related to an integration, with respect to time, of the time difference detector output signal;
(i) third sample-and-hold means, electrically connected to the integrating amplifier means, the third sample-and-hold means for receiving the sawtooth signal and for producing a third sample-and-hold output signal that is related to the sawtooth signal;
(j) voltage-controlled-oscillator means, electrically connected to the third sample-and-hold means, the voltage-controlled-oscillator means for receiving the third sample-and-hold output signal and for producing a VCO output signal characterized by a VCO output signal frequency that is related to the third sample-and-hold output signal;
(k) Y counter means, electrically connected to the voltage-controlled oscillator means, the Y counter means for receiving the VCO output signal and for producing a Y counter output signal, the Y counter output signal characterized by a Y counter output signal frequency that is equal to the VCO output signal frequency divided by an integer factor Y;
(l) C counter means, electrically connected to the Y counter means, the C counter means for receiving the Y counter output signal and for producing a C counter output signal that is characterized by a C counter output signal frequency that is equal to the Y counter output signal frequency divided by an integer factor C;

wherein the Y counter output serves to synchronize, to the reference signal, operation of the first sample-and-hold means and the second sample-and-hold means.

* * * * *